United States Patent
Chang et al.

(10) Patent No.: US 9,652,563 B2
(45) Date of Patent: May 16, 2017

(54) METHOD OF DESIGNING RANDOM PATTERN, APPARATUS FOR DESIGNING RANDOM PATTERN, AND OPTICAL SUBSTRATE INCLUDING RANDOM PATTERN ACCORDING TO THE SAME METHOD

(71) Applicant: LG INNOTEK CO., LTD., Seoul (KR)

(72) Inventors: Woo Young Chang, Seoul (KR); Seung Heon Lee, Seoul (KR); Chi Goo Jun, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 681 days.

(21) Appl. No.: 14/109,141

(22) Filed: Dec. 17, 2013

(65) Prior Publication Data
US 2014/0172379 A1    Jun. 19, 2014

(30) Foreign Application Priority Data

Dec. 17, 2012  (KR) .................... 10-2012-0147663

(51) Int. Cl.
*G06F 7/48* (2006.01)
*G06F 17/50* (2006.01)
(Continued)

(52) U.S. Cl.
CPC ........ *G06F 17/50* (2013.01); *G02F 1/134309* (2013.01); *G06F 3/044* (2013.01); *G02F 1/13338* (2013.01); *G06F 2203/04112* (2013.01)

(58) Field of Classification Search
CPC ........ G06F 3/044; G06F 3/041; G06F 3/0488; G05B 19/182; G05B 5/045; G02B 5/045;
(Continued)

(56) References Cited

U.S. PATENT DOCUMENTS

| | | | | |
|---|---|---|---|---|
| 6,522,375 B1* | 2/2003 | Jang | .................. | G02F 1/133553 349/113 |
| 8,284,356 B2* | 10/2012 | Naka | ................. | G02F 1/133504 349/113 |

(Continued)

FOREIGN PATENT DOCUMENTS

| | | |
|---|---|---|
| CN | 101268406 A | 9/2008 |
| CN | 102723126 A | 10/2012 |

(Continued)

OTHER PUBLICATIONS

Aurenhammer, F. "Voronoi Diagrams—A Survey of a Fundamental Geometric Data Structure" ACM Computing Surveys, ACM, New York, NY. vol. 23:3, pp. 345-405. Sep. 1, 1991.
(Continued)

*Primary Examiner* — Kandasamy Thangavelu
(74) *Attorney, Agent, or Firm* — Saliwanchik, Lloyd & Eisenschenk (57) ABSTRACT

Disclosed are a method of designing a random pattern, an apparatus for designing a random pattern and an optical substrate including a random pattern according to the same method. The method includes setting a plurality of unit valid pattern regions in a pattern design region; forming a random point coordinate in the unit valid pattern region; and connecting the random point coordinate in the unit valid pattern region to other random point coordinates adjacent to the random point coordinate in a first direction or a second direction.

9 Claims, 10 Drawing Sheets

(51) Int. Cl.
*G02F 1/1343* (2006.01)
*G06F 3/044* (2006.01)
*G02F 1/1333* (2006.01)

(58) Field of Classification Search
CPC .... G02B 6/0065; H05K 9/0086; G01B 11/2441; G02F 1/133504; G02F 1/33553
See application file for complete search history.

(56) References Cited

U.S. PATENT DOCUMENTS

| | | | | |
|---|---|---|---|---|
| 2004/0120136 | A1* | 6/2004 | Olczak | G05B 19/182 362/601 |
| 2007/0014020 | A1* | 1/2007 | Bourdelais | G02B 6/0065 359/619 |
| 2009/0115962 | A1 | 5/2009 | Bovet et al. | |
| 2009/0322757 | A1 | 12/2009 | Kanoh et al. | |
| 2010/0027294 | A1* | 2/2010 | Lee | G02B 5/045 362/620 |
| 2010/0128276 | A1* | 5/2010 | De Groot | G01B 11/2441 356/450 |
| 2011/0102361 | A1 | 5/2011 | Philipp | |
| 2012/0262412 | A1* | 10/2012 | Guard | G06F 3/044 345/174 |
| 2013/0028503 | A1* | 1/2013 | Wakui | H05K 9/0086 382/141 |
| 2013/0113502 | A1 | 5/2013 | Yilmaz et al. | |
| 2013/0207911 | A1* | 8/2013 | Barton | G06F 3/0488 345/173 |
| 2014/0083742 | A1 | 3/2014 | Gao et al. | |
| 2014/0085551 | A1* | 3/2014 | Koo | G06F 3/041 349/12 |
| 2014/0152580 | A1* | 6/2014 | Weaver | G06F 3/041 345/173 |

FOREIGN PATENT DOCUMENTS

| | | |
|---|---|---|
| DE | 102010043055 A1 | 5/2011 |
| DE | 20-2012-101400 U1 | 5/2012 |
| EP | 0446038 A2 | 9/1991 |

OTHER PUBLICATIONS

European Search Report in European Application No. 13197456, dated Mar. 26, 2014.
Office Action dated Mar. 31, 2016 in Chinese Application No. 201310693802.0.

\* cited by examiner

| Classification | Previous lattice Pattern | | | Random Pattern | | | Note |
|---|---|---|---|---|---|---|---|
| | #1 Mesh Pitch 200μm | #2 Mesh Pitch 250μm | #3 Mesh Pitch 300μm | #1 Polygon (Polygon) | #2 Polygon (Rectangle) | #3 Spline Curve | |
| Image | | | | | | | |
| *Moire Level (Avg.) Tablet | 3.2 | 3.5 | 3.5 | 5.0 | 5.0 | 5.0 | |
| NBPC | 4.3 | 3.5 | 3.5 | 5.0 | 5.0 | 5.0 | Detail:7page |
| Monitor | 2.8 | 4.6 | 4.7 | 5.0 | 5.0 | 5.0 | |
| Avoidance angle(Monitor) | 40° | 45° | 25° | All sections | All sections | All sections | |

| Classification | Pixel pattern |
|---|---|
| Full white | |
| SuperPixel | |
| TwoPixel | |
| Horizontal Line | |
| Vertical Line | |
| Gradient Horizontal | |

| CFG Pattern | Tablet(8.9") | | | | | | | NBPC(14.1") | | | | | | | Monitor(19", 20.1") | | | | | | |
|---|---|---|---|---|---|---|---|---|---|---|---|---|---|---|---|---|---|---|---|---|---|
| | Average score (Tilt) | Solid | Dots Super Pixel | Dots Two Pixel | Lines Horizantal | Lines Vertical | Gradient (RGB) | Average score (Tilt) | Solid | Dots Super Pixel | Dots Two Pixel | Lines Horizantal | Lines Vertical | Gradient (RGB) | Average score (Tilt) | Solid | Dots Super Pixel | Dots Two Pixel | Lines Horizantal | Lines Vertical | Gradient (RGB) |
| #1 Pitch 200μm | 3.2 (20°) | 5 | 2 | 2 | 3 | 3 | 4 | 4.3 (40°) | 4 | 4 | 4 | 5 | 5 | 4 | 2.8 (40°) | 3 | 3 | 3 | 3 | 3 | 2 |
| #2 Pitch 250μm | 3.5 (20°) | 5 | 2 | 3 | 3 | 4 | 4 | 3.5 (45°) | 3 | 2 | 3 | 5 | 5 | 3 | 5.0 (45°) | 5 | 5 | 5 | 5 | 5 | 5 |
| #3 Pitch 300μm | 3.5 (20°) | 5 | 3 | 2 | 3 | 3 | 5 | 3.5 (25°) | 3 | 3 | 3 | 5 | 5 | 2 | 4.6 (25°) | 5 | 5 | 3 | 5 | 5 | 5 |
| #4 (Polygon#1) | 5.0 (0°) | 5 | 5 | 5 | 5 | 5 | 5 | 5.0 (0°) | 5 | 5 | 5 | 5 | 5 | 5 | 5.0 (0°) | 5 | 5 | 5 | 5 | 5 | 5 |
| #5 (Polygon#2) | 5.0 (0°) | 5 | 5 | 5 | 5 | 5 | 5 | 5.0 (0°) | 5 | 5 | 5 | 5 | 5 | 5 | 5.0 (0°) | 5 | 5 | 5 | 5 | 5 | 5 |
| #6 (Spline) | 4.8 (0°) | 5 | 5 | 5 | 5 | 4 | 5 | 5.0 (0°) | 5 | 5 | 5 | 5 | 5 | 5 | 5.0 (0°) | 5 | 5 | 5 | 5 | 5 | 5 |
| Note | | | | | | | | | | | | | | | | | | | | | |

Fig. 14

METHOD OF DESIGNING RANDOM PATTERN, APPARATUS FOR DESIGNING RANDOM PATTERN, AND OPTICAL SUBSTRATE INCLUDING RANDOM PATTERN ACCORDING TO THE SAME METHOD

CROSS-REFERENCE TO RELATED APPLICATION

This application claims the benefit under 35 U.S.C. §119 of Korean Patent Application No. 10-2012-0147663, filed Dec. 17, 2012, which is hereby incorporated by reference in its entirety.

BACKGROUND

The embodiment relates to a method of designing a pattern capable of avoiding a moiré phenomenon between optical substrates applied to various display equipment.

In general, a moiré pattern is a natural interference phenomenon occurring when two independent periodical patterns are superimposed onto each other at a predetermined angle.

The moiré pattern inevitably appears on all color CRT TVs due to waves, ripples or an intensity variation such as small wisps superimposed onto an image displayed on the screen.

Phosphorescence is generated on a CRT when an electron beam is incident upon a shadow mask doped with phosphor. If the phosphorescence area in the shadow mask is equal to the incident area of the electron beams, the phosphorescence pattern by the electron beam is superimposed upon a regular pattern of the shadow mask. A moiré pattern is formed on the CRT due to existence of the two regular patterns. Therefore, if moiré patterns are not formed on the CRT, it means that the electron beam emitted from the electron gun of the CRT is not exactly incident upon the center of the phosphor. In this case, an image on the CRT is fuzzy.

This is because the size of a pixel is smaller than the size of a phosphor material although the size of the pixel generated by a video board is equal to the incident area of the electron beam. Therefore, the above problem may be solved by allowing the size of the phosphor material to be equal to the size of the pixel generated by the video board.

Meanwhile, in an LCD (Liquid Crystal Display), each liquid crystal cell itself operates as a single pixel. Thus, the moiré patterns may not appear in the LCD.

However, in case of a 3D image display that implements full parallax using two lenticular plates, a flat panel display, that is, an LCD is used as an image display panel and a micro-lens array plate or two lenticular plates are superimposed thereon. Thus, when a pitch between micro-lenses or a pitch between regions in which the lenses constituting each lenticular plate make contact with each other is not exactly aligned with a pixel pitch of the LCD, a moiré pattern is generated.

Particularly, the micro-lens array plate or lenticular plate has a thickness. Thus, a viewing distance or viewing angle may be changed due to the thickness. In this case, the moiré pattern may be generated even if a pitch between micro-lenses or a pitch between regions in which the lenses constituting each lenticular plate make contact with each other is exactly aligned with a pixel pitch of the LCD.

Figure 1:
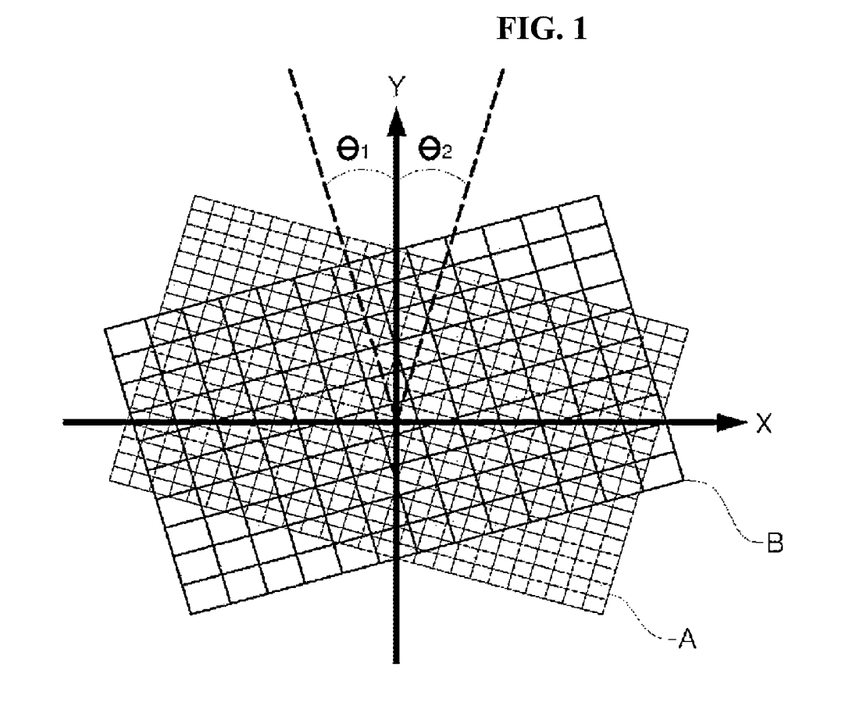
FIG. 1 is a schematic diagram illustrating a mechanism of avoiding a moiré phenomenon caused due to the superimposition and overlap of two sheets of optical substrates having a specific pattern used in a device, a touch panel or a display to which an optical sheet is applied.

FIG. 1 is a schematic diagram illustrating a mechanism of avoiding a moiré phenomenon caused due to the superimposition and overlap of two optical substrates having a specific pattern used in a device, a touch panel or a display to which an optical sheet is applied.

That is, a lower optical substrate B having a general lattice pattern and an upper optical substrate A having another lattice pattern are inevitably stacked in an overlap structure in equipment, so that the moiré phenomenon occurs. According to the related art, in order to avoid the moiré phenomenon, the substrates are rotated at specific tilt angles θ1 and θ2, respectively and disposed in the equipment at the positions which the moiré phenomenon is minimized.

Figure 2:
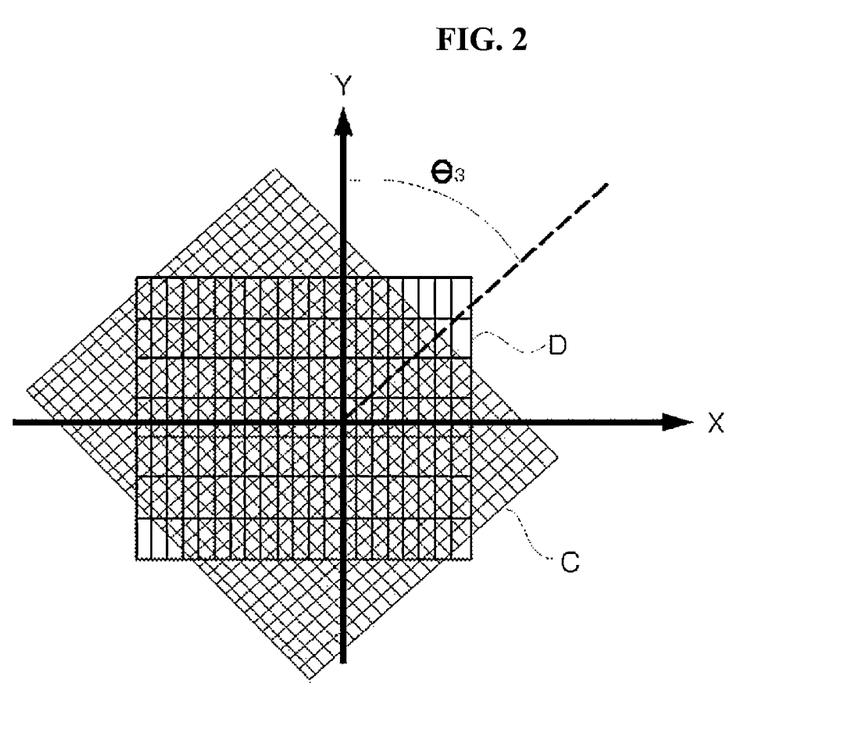
FIG. 2 is a schematic diagram illustrating a method of avoiding the generation of a moiré phenomenon even in the stack structure of an optical substrate C having a lattice pattern on a display D.

As shown in FIG. 2, since the moiré phenomenon occurs in the stack structure of an optical substrate C having a lattice pattern and disposed on a display D, the optical substrate C is also rotated at a specific avoidance angle θ3 to avoid the moiré phenomenon when manufacturing the equipment.

However, since this scheme requires searching for a moiré avoidance section at a specific angle between the lattice patterns and the section is very narrow, it is very difficult to apply the above scheme in practice. In a case of a display such as an LED, since the upper lattice patterns are individually designed according to a cell type (pixel pitch), it is impossible to universally utilize the scheme, and in addition, it is difficult to completely remove the moiré pattern.

As a related art, there is Korean unexamined patent publication No. 10-2005-0013020

BRIEF SUMMARY

To solve the above problems, the embodiment provides a method of designing a pattern which is capable of absolutely removing a moiré phenomenon caused due to the overlap of regular patterns through a pattern design created by using a random pattern design method and in addition, of avoiding the moiré phenomenon regardless of an avoidance angle and pitch.

According to the embodiment, there is provided a method of designing a random pattern including setting a plurality of unit valid pattern regions in a pattern design region; forming a random point coordinate in the unit valid pattern region; and connecting the random point coordinate in the unit valid pattern region to other random point coordinates adjacent to the random point coordinate in a first direction or a second direction.

According to the embodiment, the method of designing a random pattern may be implemented to remove a moiré phenomenon caused due to an overlap of regular patterns, so that the moiré avoidance may be achieved regardless of any avoidance angles and pitches.

In addition, since a pattern design is enabled to avoid moiré regardless of a specific tilt angle, various patterns such as a lattice pattern, a circular pattern or a polygonal pattern are applicable regardless of a lower portion and a pitch of the lower portion and any moiré generations are completely removable, so that a sheet and a substrate applied to various optical equipment may be implemented.

DETAILED DESCRIPTION

Hereinafter, the structure and the operation according to the embodiment will be described in detail with reference to accompanying drawings. In the following description based on the accompanying drawings, the same elements will be assigned with the same reference numerals regardless of drawing numbers, and the repetition in the description of the same elements having the same reference numerals will be omitted in order to avoid redundancy. Although the terms "first" and "second" may be used in the description of various elements, the embodiment is not limited thereto. The terms "first" and "second" are used to distinguish one element from the other elements.

Figure 3:
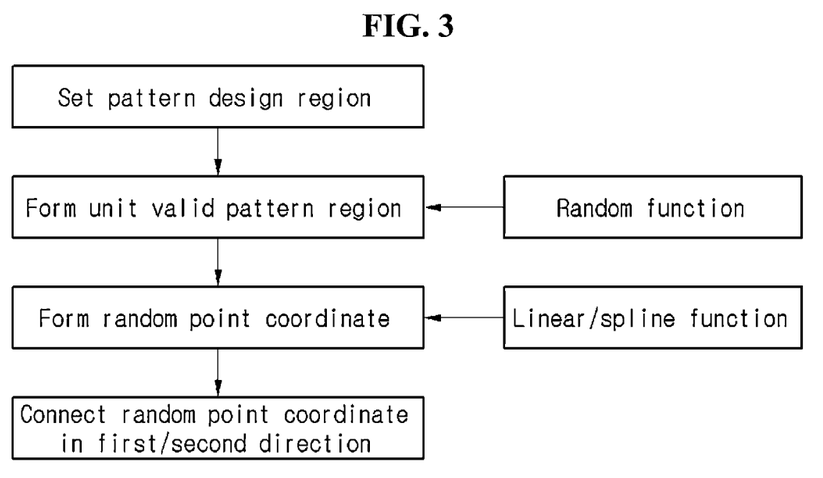
FIGS. 3 and 4 are a flowchart and a block diagram illustrating a method of designing a random pattern according to the embodiment.
Figure 4:
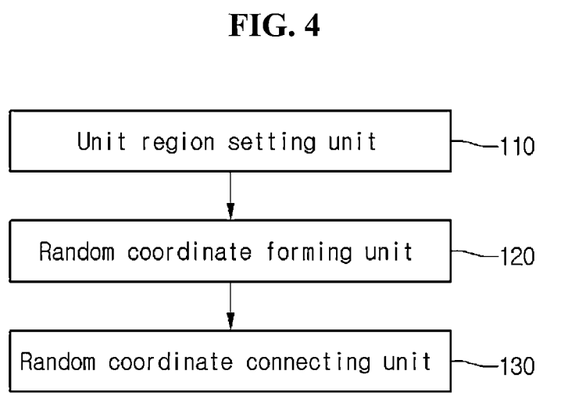

FIGS. 3 and 4 are a flowchart and a block diagram illustrating a method of designing a random pattern according to the embodiment.

Referring to accompanying drawings, a method of designing a random pattern according to the embodiment includes the processes of setting a plurality of unit valid pattern regions in a pattern design region, forming random point coordinate in the unit valid pattern region, and connecting the random point coordinate in the unit valid pattern region to a random point coordinate adjacent in a first or second direction.

As shown in FIG. 3, the method of designing a random pattern according to the embodiment may be implemented with a program including software. To this end, as shown in FIG. 4, the program may include a unit region setting unit 110 to form a plurality of unit valid pattern regions in a pattern design region in which a pattern is formed, a random coordinate forming unit 130 to form at least one random point coordinate in the unit valid pattern region, and a random coordinate connecting unit 130 to form a connecting line with which adjacent random point coordinates are connected in a specific direction. As used in various configurations according to the embodiment, the term "~unit" refers to software or a hardware structural element such as FPGA or ASIC, and the "~unit" performs some roles. However, the "~unit" is not limited to software or hardware. The "~unit" can be configured to be stored in an addressable storage medium and to play at least one processor. Accordingly, for example, the "~unit" includes software structural elements, object-oriented software structural elements, class structural elements, task structural elements, processes, functions, attributes, procedures, subroutines, segments of a program code, drivers, firmware, microcode, circuit, data, database, data structures, tables, arrays, and variables. Functions provided in structural elements and "~units" may be engaged by the smaller number of structural elements and "~units", or may be divided by additional structural elements and "~units". In addition, the constituent elements and "~units" may be implemented to reproduce at least one CPU in a device or a security multimedia card.

Figure 5:
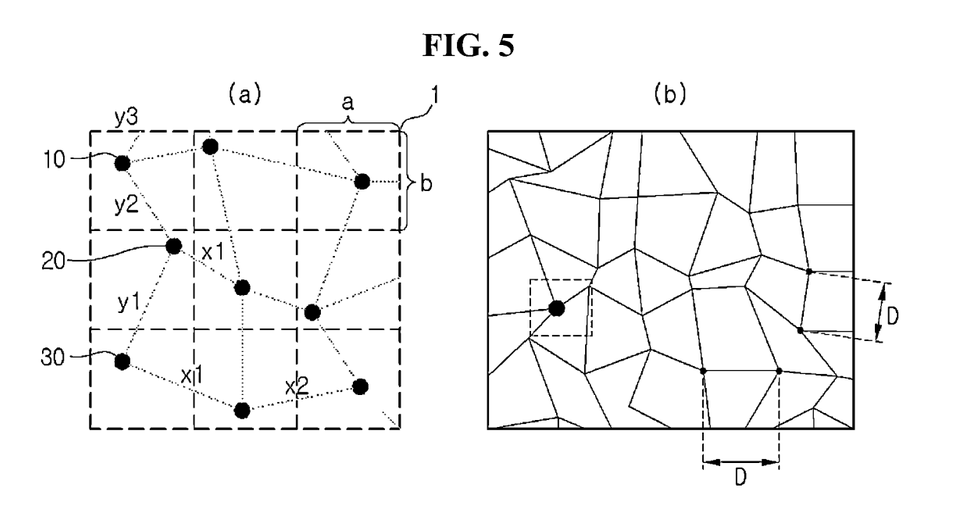
FIGS. 5 to 11 are schematic diagrams illustrating the method of designing a random pattern according to the embodiment described above with reference to FIGS. 2 and 3.
Figure 6:
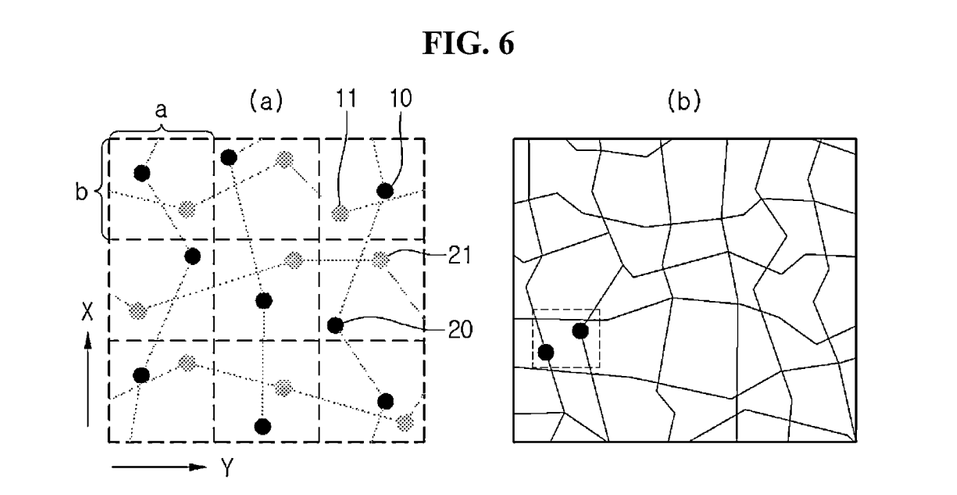
Figure 7:
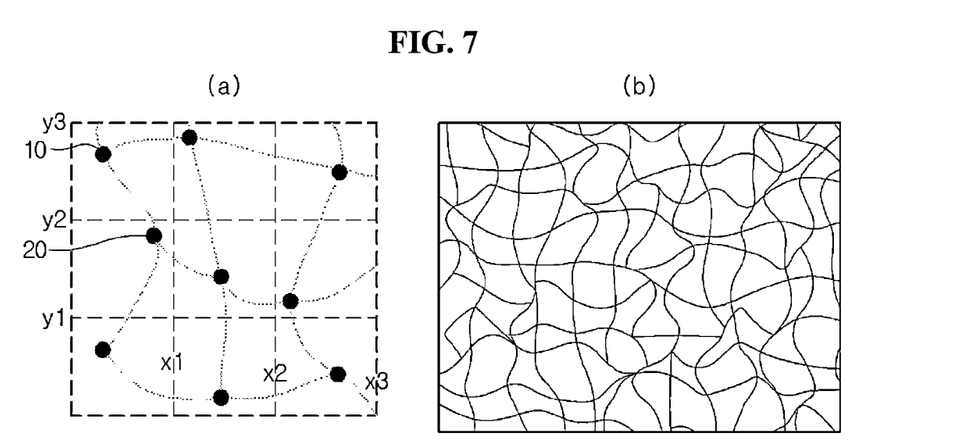

FIGS. 5 to 7 are schematic diagrams illustrating the method of designing a random pattern according to the embodiment described above with reference to FIGS. 2 and 3.

Hereinafter the method of designing a random pattern will be sequentially described with reference to FIGS. 1 and 5 to 7.

According to the method of designing a random pattern of the embodiment, as shown in FIG. 5, a plurality of unit valid pattern regions a and b may be set in a pattern design region 1. The pattern design region 1 refers to the standard required to a product, such as a substrate or a sheet, requiring a pattern design. The pattern design region 1 may be determined based on information about the standard which is input to a program or may refer to the standard for a product which is actually produced based on information values input according to an external sensor.

For instance, after setting the pattern design region 1, the unit valid pattern regions a and b are set into the pattern design region 1. As shown in FIG. 5, the unit valid pattern regions a and b may be divided into virtual spaces having the same standard size and according to the embodiment, random point coordinates 10 and 20 may be formed in the unit valid pattern regions. In the embodiment depicted in FIG. 5, one random point coordinate 10 or 20 is formed in one unit valid pattern region as one example.

For example, the horizontal coordinate x and the vertical coordinate y constituting one random point coordinate may be created by using following functions:

$$x = (\text{Random number 1} * \text{Random rate} + a) * \text{Pitch1}$$

$$y = (\text{Random number 2} * \text{Random rate} + b) * \text{Pitch2}$$

In the above functions, the random numbers 1 and 2 are decimals different from each other between 0 and 1. For example, when the random number 1 is 0.001, the random number 2 may be 0.9976. The values below the decimal point may be variously changed.

The random rate may be controlled in the range of 0% to 100%.

The 'a' and 'b' denote the position of a unit valid pattern region. For example, when the unit valid pattern regions exist as shown in FIG. 5, the positions of each unit valid pattern region (a, b) may be expressed as following table:

| (1, 3) | (2, 3) | (3, 3) |
|--------|--------|--------|
| (1, 2) | (2, 2) | (3, 2) |
| (1, 1) | (2, 1) | (3, 1) |

The pitches 1 and 2 represent distances between the unit valid pattern regions. That is, the pitch 1 is a width of one unit valid pattern region, and the pitch 2 is a height of one unit valid pattern region.

Thereafter, each random point coordinate formed in each unit valid pattern region a and b is connected to other random point coordinates adjacent thereto in the first or second direction, so that a linear pattern having a polygonal shape may be designed. That is, in the case of one random point coordinate 20 shown in FIG. 5, the random point coordinate 20 is connected to other random point coordinates 10 and 30 in the first direction through a connection line x1 and in the second direction through connection lines y1 and y2, so that the random point coordinate 20 may be connected to adjacent random point coordinates 10 and 30, respectively.

In this case, if the random point coordinates adjacent to each other in the first and second directions are connected to each other and the number of the unit valid pattern regions adjacent to the unit valid pattern region is 'n', the number of connecting lines connected to the random point coordinate in the unit valid pattern region is 'n', where 'n' is a natural number. That is, since there exist three unit valid patterns adjacent to the unit valid pattern region including the random point coordinate 20 as shown in (a) of FIG. 5, three connecting lines are connected to the random point coordinate 20. Of course, this is limited to the case that one random point coordinate is formed in the unit valid pattern region. FIG. 5(b) shows an image of a final design obtained according to the above-described scheme.

Meanwhile, referring to FIG. 5, the distance D between one random point coordinate and another random point coordinate adjacent to the one random point coordinate, that is, the distance D between one cross point and another cross point may be in the range of 20 μm to 1 mm. When the distance D is shorter than 20 μm, a user watching a display may not distinguish the cross points from each other so that the cross points may look like a single cross point, so the connecting lines may look like an overlap line. Thus, the visibility and mass production may be deteriorated. In addition, when the distance D is longer than 1 mm, the resistance value is increased so that the sensibility may be deteriorated. Further, when the distance D is longer than 1 mm, the region may be larger than a tip touched with a finger of an ordinary person, so that a hand touch may not be sensed in a capacitive touch panel. Preferably, the distance D may be in the range of 50 μm to 600 μm.

FIG. 6 is a schematic diagram illustrating another example of the embodiment different from that of FIG. 5.

Differences between FIGS. 5 and 6 are that two random point coordinates are formed in a single unit valid pattern region and the connecting directions of the random point coordinates 10 and 11 existing in the same unit valid pattern region a and b to random point coordinates adjacent to them are different from each other. That is, the first coordinate 10 among the random point coordinates in the unit valid pattern region is connected to the random point coordinate adjacent to the first coordinate 10 in the first direction (Y-axis direction), and the second coordinate 11 among the random point coordinates in the unit valid pattern region is connected to the random point coordinate adjacent to the second coordinate 11 in the second direction (X-axis direction). Of course, in this case, each random point coordinate may be connected to only one of two random point coordinates existing in the each of adjacent unit valid pattern regions. FIG. 6(b) shows an image of a final design obtained according to the above-described scheme.

In the embodiments of FIGS. 5 and 6, the random point coordinates in the adjacent unit valid pattern regions are connected to each other at the shortest distances, that is, with the straight lines, so that the final designed pattern may have a polygonal shape.

FIG. 7 is a schematic diagram illustrating another example of a method of designing a random pattern according to the embodiment.

The scheme of dividing a pattern design region into unit valid pattern regions and then, setting one random point coordinate into each unit valid pattern region is identical to that of FIG. 5.

However, the random point coordinates in each unit valid pattern region may be connected to each other by using a spline function. In this case, a simple closed curve having four sides are formed. All spline functions (for example, B-spline, quadratic spline, and cubic spline functions) may be employed regardless of any types of spline functions.

Although the method of designing a random pattern, which is implemented through a scheme of connecting coordinates to each other after one or two random points are formed in the unit valid pattern region by using a random function, is described as examples with reference to FIGS. 5 to 7, the number of coordinates and the connections are not limited thereto. When a plurality of coordinates are formed in each unit valid pattern region and the coordinates are connected to each other according to the above-described scheme, a random pattern design having a straight line type connection structure or a curved type connection structure according to the embodiment may be implemented.

Figure 8:
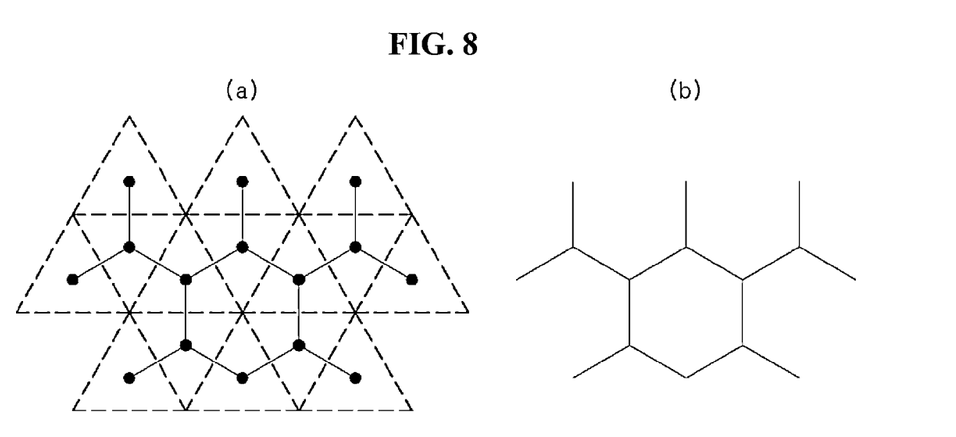
Figure 9:
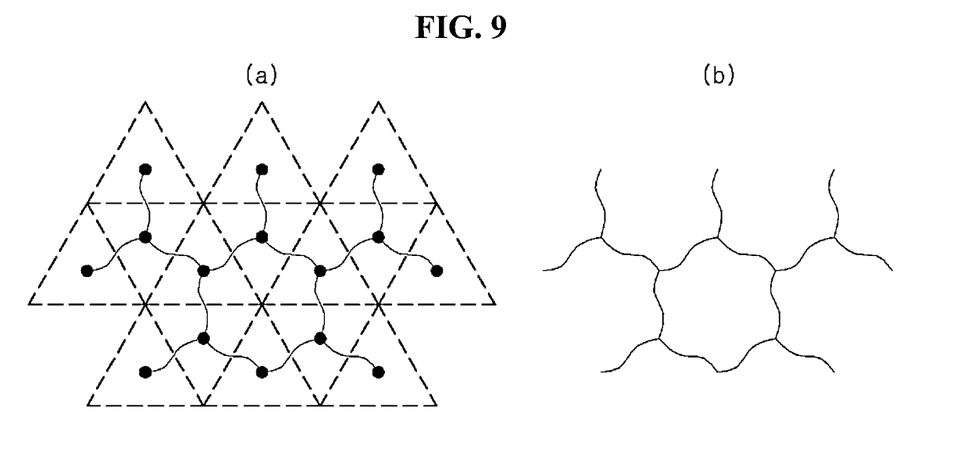

Meanwhile, referring to FIGS. 8 and 9, according to another embodiment, the unit valid pattern region may have a triangular shape. The unit valid pattern regions may be arranged in such a manner that the triangular shape is meshed with the inverted-triangular shape. In this case, as shown in FIG. 8, the coordinates may be connected to each other with straight lines. To the contrary, as shown in FIG. 9, the coordinates may be connected to each other with curved lines.

Figure 10:
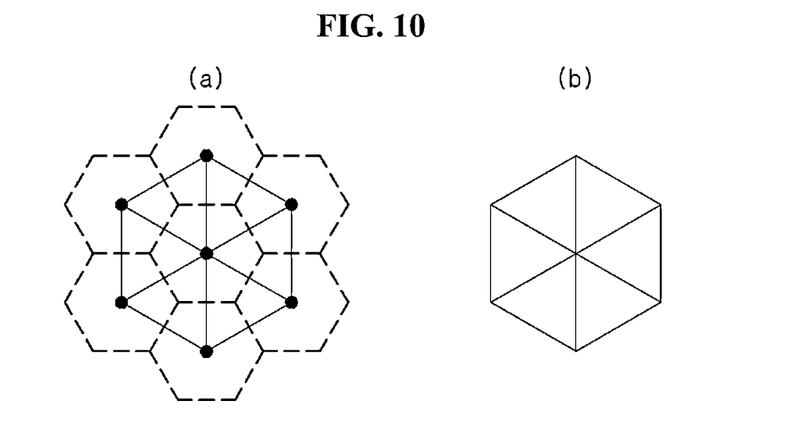
Figure 11:
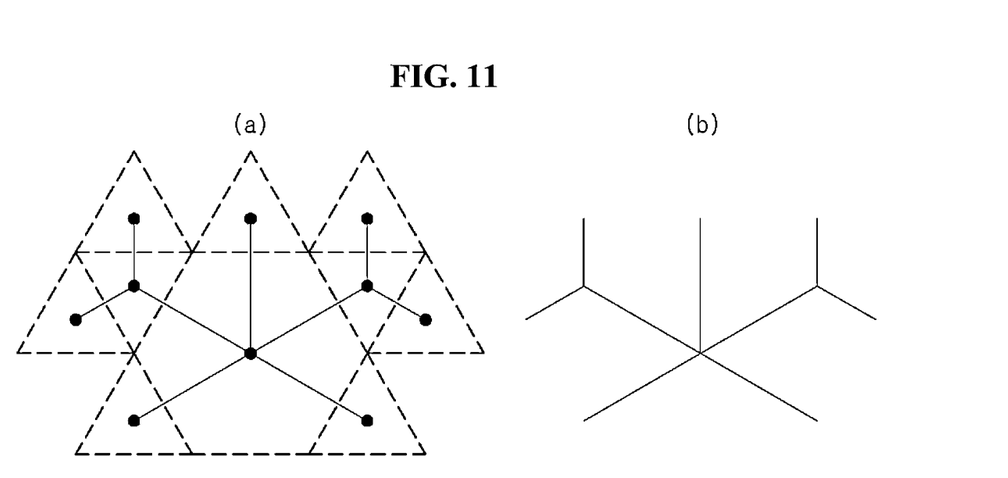
Figure 12:
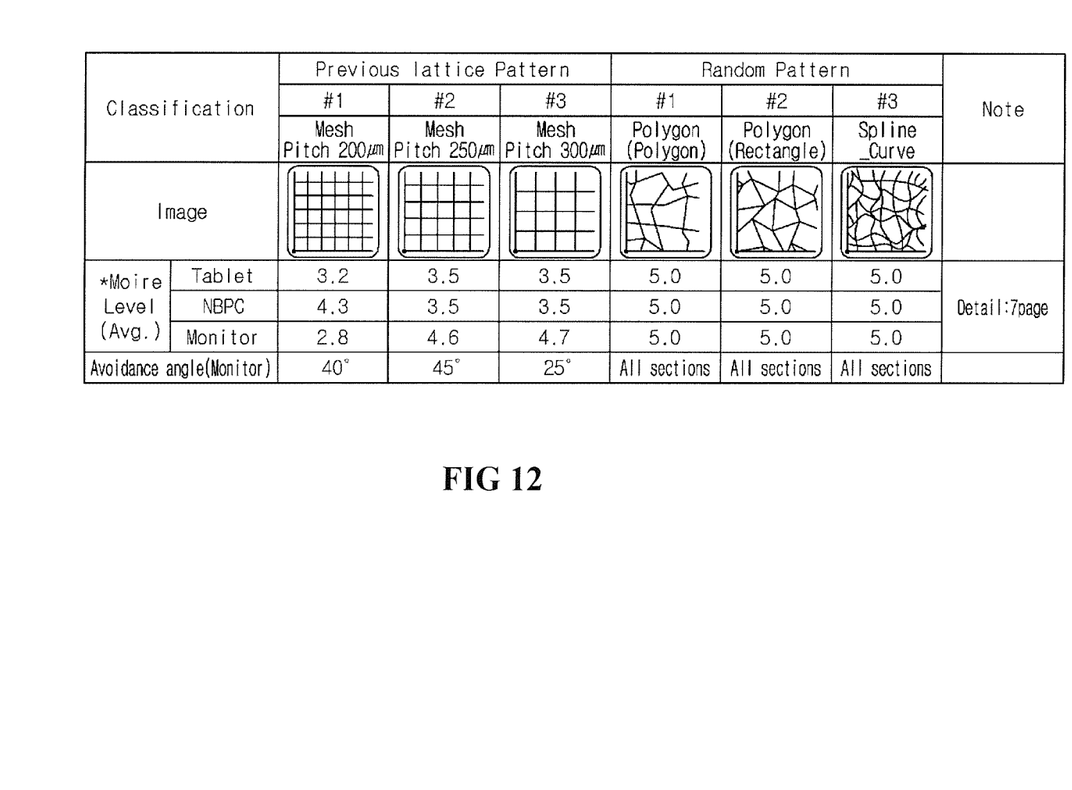
FIG. 12 is a view showing a comparison of the moiré levels and avoidance angles between optical substrates #1 to #3 having the lattice patterns according to the related art described in FIG. 1 with the moiré levels and avoidance angles between optical substrates having the random patterns according to the embodiment.

Then, as shown in FIG. 10, the unit valid pattern region may have a hexagonal shape. In this case, the coordinates are connected to each other, so that a cubic shape including a plurality of triangles may be formed, Next, as shown in FIG. 11, the unit valid pattern region may have a mixed shape of various figures. That is, the unit valid pattern region may have a mixed shape of a triangle and a hexagon. Although the mixture of triangular and hexagonal shapes is depicted in the drawing, the embodiment is not limited thereto, and for example, at least two figures may be variously mixed.

FIG. 8 is a view showing a comparison of the moiré levels and avoidance angles between optical substrates #1 to #3 having the lattice patterns according to the related art described in FIG. 1 with the moiré levels and avoidance angles between optical substrates having the random patterns according to the embodiment. The patterns have the same line width of 3 μm. The moiré levels are represented as "1>2>3>4>5" which are numerical values representing moiré intensities, where '1' represents a level at which the moiré is distinctly seen by a general user, '2' represents a level at which the moiré is dimly seen by a general user, '3' represents a level at which the moiré is not felt by a general user but is recognized by an expert, and '5' is a level at which the moiré is not recognized by an expert. Although the line width is limited to 3 μm in the embodiment, various line widths may be adopted in the embodiment may.

As proposed in the embodiment, in three products of a tablet, a laptop computer and a monitor, when the existing lattice patterns are formed to have mesh pitches of 200 μm, 250 μm and 300 μm, respectively, various moiré levels in the range of 3.2~4.2 may be represented. These moiré levels are obtained by reflecting the avoidance angles of 40°, 45° and 25°. For example, in a case of a monitor, when the avoidance angles of 40°, 45° and 25° are reflected, the moiré levels of 2.8, 4.6 and 4.7 may be obtained, respectively.

To the contrary, under the same condition, when the optical substrates #4, #5 and #6, to which the random patterns having irregular polygon, rectangular and spline-curved shapes are applied according to the embodiment, are applied to three products of a tablet, a laptop computer and a monitor, the moiré level of 5.0 is measured in all sections, at which the expert may not recognize the moiré, so that it may be confirmed that the moiré is avoided. Specifically, there is no need to reflect any avoidance angles upon the optical substrates having the random pattern according to the embodiment. In addition, regardless of any avoidance angles, it may be confirmed that the moiré avoidance may be implemented in all sections at the same level.

Figure 13:
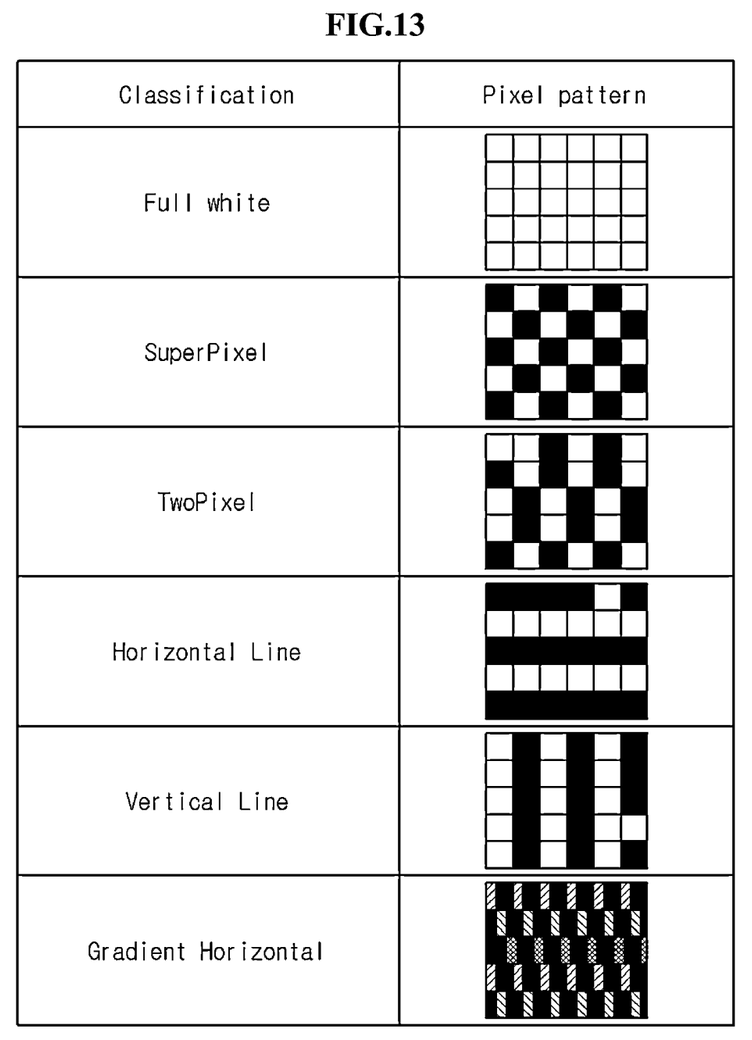
FIGS. 13 and 14 are views illustrating a pattern moiré verification test of an optical substrate having a pattern for a TFT-LCD.
Figure 14:
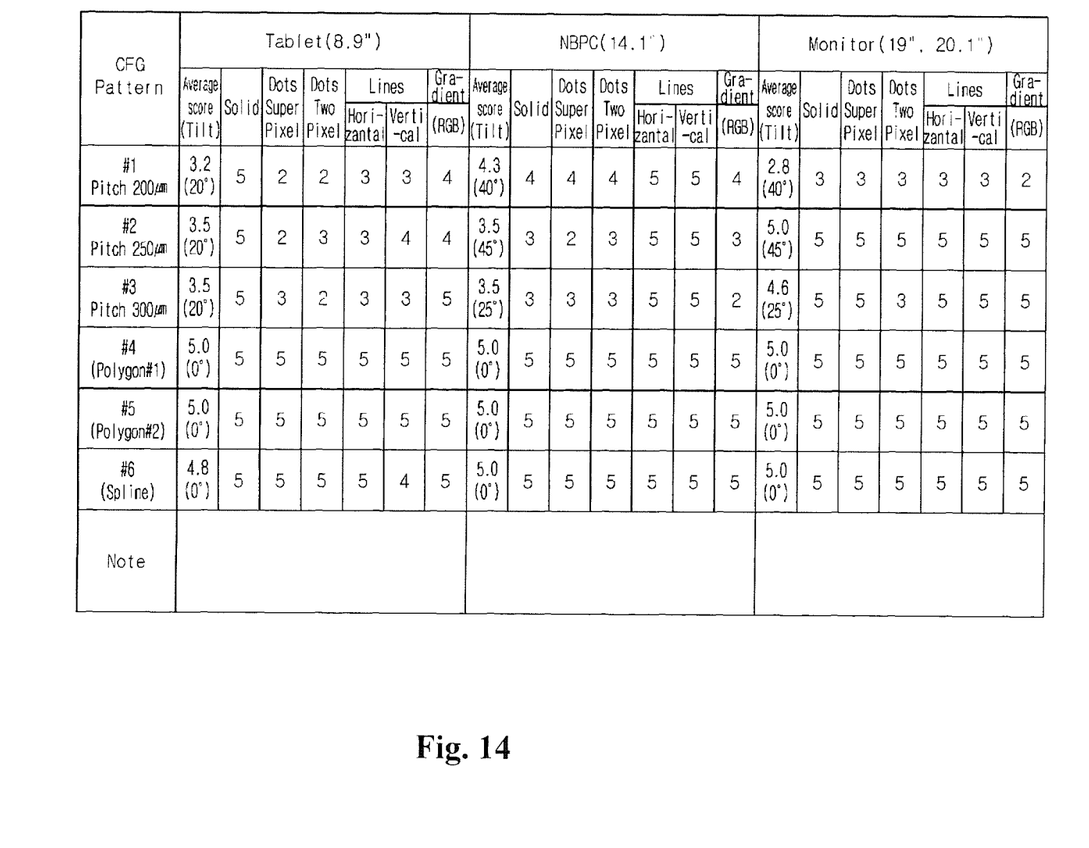

FIGS. 13 and 14 are views illustrating a pattern moiré verification test of an optical substrate having a pattern for a TFT-LCD. When each test item is applied to a lattice pattern and a random pattern having the same line width as in FIGS. 7 and 8, the test items are as follows:

1) All pixels are turned on in a full white-pixel pattern as a full white condition. This is for the purpose of verifying the moiré by the line width between RGB pixels.

2) The test is performed after the pixels in a diagonal direction are turned on in a super-pixel pattern. This is for the purpose of verifying the moiré as the line width is increased in the diagonal direction.

3) The test is performed after two row pixels in a longitudinal direction and the pixels in a diagonal direction are turned on in a two-pixel pattern. This is for the purpose of verifying the moiré as the line width is increased in the longitudinal direction.

4). The pixels are disposed in the state that the pixels are sequentially turned on/off in a horizontal line direction. This is for the purpose of verifying the moiré variation as the line width is increased in the transverse direction.

5) The pixels are disposed in the state that the pixels are sequentially turned on/off in a vertical line direction. This is for the purpose of verifying the moiré variation as the line width is increased in the vertical direction.

6) The gradient horizontal-R/G/B pixels are turned on/off. This is for the purpose of verifying the moiré as the pitches of each color are changed.

The results of the above-described test items are shown in FIG. 10.

When the CGF pattern, which is applied to the three products of a tablet, a laptop computer and a monitor, is formed in the mesh patterns of 200 μm, 250 μm or 300 μm instead of a pitch lattice pattern as shown in FIG. 7, various moiré levels in the range of 3.2~4.7 are shown. It may be identified that the moiré levels are obtained when the avoidance angles of 40°, 45° and 25° are applied in a case of a monitor, the avoidance angles of 20°, 20° and 20° are applied in a case of a tablet, and the avoidance angles of 40°, 45° and 25° are applied in a case of a laptop computer.

To the contrary, in cases of the random patterns of #4, #5 and #6 according to the embodiment, it may be identified that the uniform moiré levels of '5' are shown regardless of any avoidance angles.

Therefore, according to the method of designing a random pattern of the embodiment, since a pattern design is enabled to avoid moiré regardless of a specific tilt angle, various patterns such as a lattice pattern, a circular pattern or a polygonal pattern are applicable regardless of a lower portion and a pitch of the lower portion and any moiré generations are absolutely removable, so that a sheet and a substrate applied to various optical equipment may be implemented.

As described above, a conductive material is formed on a surface of an optical substrate according to a pattern line after designing a pattern so that the method of designing a random pattern according to the embodiment may be implemented as an optical substrate having a conductive material pattern (for example, by applying processes of implementing various pattern, such as a conductive pattern formed on a transparent sheet surface or a convex pattern formed by filling a concave groove, which is formed on a surface of a transparent substrate according to a random pattern design, with a conductive material or by sputtering a conductive material). Such an optical substrate may be universally applied to an optical substrate requiring an electrode sensor pattern applied to a touch panel or a pattern applied to various optical sheets or displays.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An optical substrate comprising:
a substrate formed with a pattern design region including a plurality of unit valid pattern regions;
a random pattern on the substrate; and
a conductive material pattern corresponding to the random pattern,
wherein the random pattern is formed by connecting a random point coordinate in the unit valid pattern regions to other random point coordinates adjacent to the random point coordinate, and
wherein the adjacent random point coordinates in the unit valid pattern regions are connected to each other in a spline curved shape.

2. The optical substrate of claim 1, wherein a distance between the random point coordinates is in a range of 20 μm to 1 mm.

3. The optical substrate of claim 2, wherein a distance between the random point coordinates is in a range of 50 μm to 600 μm.

4. The optical substrate of claim 1, wherein the random point coordinates include a horizontal coordinate and a vertical coordinate.

5. The optical substrate of claim 1, wherein the unit valid pattern regions include at least one of a triangular shape, a hexagon shape, and a quadrangle shape.

6. The optical substrate of claim 1, wherein the conductive material pattern is formed in a concave shape or a convex shape on a surface of the optical substrate.

7. An apparatus for designing a random pattern, the apparatus comprising:
a processor;
a memory storing a program of instructions for:

a unit region setting unit to form a plurality of unit valid pattern regions in a pattern design region in which a pattern is formed;

a random coordinate forming unit to form at least two random point coordinates in the unit valid pattern regions; and a random coordinate connecting unit to form a connecting line that interconnects adjacent random point coordinates in a predetermined direction, wherein the random coordinate connecting unit connects the adjacent random point coordinates of the unit valid pattern region to each other in a spline curved shape.

8. The apparatus of claim 7, wherein the connection between the adjacent random point coordinates in the unit valid pattern region is formed in such a manner that the connection between the connected random point coordinates has a shortest distance.

9. The apparatus of claim 7, wherein a distance between the random point coordinates is in a range of 20 µm to 1 mm.

* * * * *